United States Patent
Mikkelsen et al.

(10) Patent No.: US 9,391,632 B1
(45) Date of Patent: Jul. 12, 2016

(54) METHOD AND SYSTEM FOR IMPLEMENTING AN EXTENDED RANGE APPROXIMATION ANALOG-TO-DIGITAL CONVERTER

(71) Applicant: OmniVision Technologies, Inc., Santa Clara, CA (US)

(72) Inventors: Sindre Mikkelsen, Ski (NO); Tore Martinussen, Strømmen (NO)

(73) Assignee: OmniVision Technologies, Inc., Santa Clara, CA (US)

( * ) Notice: Subject to any disclaimer, the term of this patent is extended or adjusted under 35 U.S.C. 154(b) by 40 days.

(21) Appl. No.: 14/606,837

(22) Filed: Jan. 27, 2015

(51) Int. Cl.
H04N 5/378 (2011.01)
H03M 1/46 (2006.01)
H03M 1/18 (2006.01)
H04N 5/3745 (2011.01)
H04N 9/04 (2006.01)
H04N 5/374 (2011.01)

(52) U.S. Cl.
CPC .............. H03M 1/462 (2013.01); H03M 1/181 (2013.01); H04N 5/378 (2013.01); H04N 5/37455 (2013.01); H04N 9/045 (2013.01)

(58) Field of Classification Search
CPC .. H03M 1/462; H03M 1/181; H04N 5/37455; H04N 5/378; H04N 9/045; H04N 5/37457; H04N 5/335; H04N 5/3698; H04N 5/3742; H04N 5/3765; H04N 5/369; H04N 5/3745; H04N 5/3741; H04N 5/357

USPC ................... 348/301, 302, 308, 312, E05.091
See application file for complete search history.

(56) References Cited

U.S. PATENT DOCUMENTS

| | | | | | |
|---|---|---|---|---|---|
| 4,764,750 | A | * | 8/1988 | Kawada | H03M 1/0678 341/122 |
| 5,334,998 | A | * | 8/1994 | Priem | G09G 1/285 345/545 |
| 2012/0026023 | A1 | * | 2/2012 | Inoue | H03M 1/069 341/110 |
| 2014/0070968 | A1 | * | 3/2014 | Janakiraman | H03M 1/0697 341/110 |
| 2014/0118176 | A1 | * | 5/2014 | Price | H03M 1/462 341/161 |
| 2015/0091744 | A1 | * | 4/2015 | Shen | H03M 1/04 341/110 |

* cited by examiner

*Primary Examiner* — Hung Lam
(74) *Attorney, Agent, or Firm* — Blakely Sokoloff Taylor & Zafman LLP

(57) ABSTRACT

A method of implementing extended range successive approximation analog-to-digital converter (ADC) starts with a readout circuitry acquiring an image data from a row in a color pixel array. ADC circuitry in the readout circuitry then generates an ADC pedestal for the row. Successive Approximation Register (SAR) included in ADC circuitry then stores ADC pedestal. SAR includes a plurality of bits and an additional bit that is a duplicate of one of the plurality of bits. ADC circuitry samples the image data from the row against ADC pedestal stored in SAR to obtain a sampled input data. ADC circuitry then converts the sampled input data from analog to digital to obtain an ADC output value. Other embodiments are described.

25 Claims, 5 Drawing Sheets

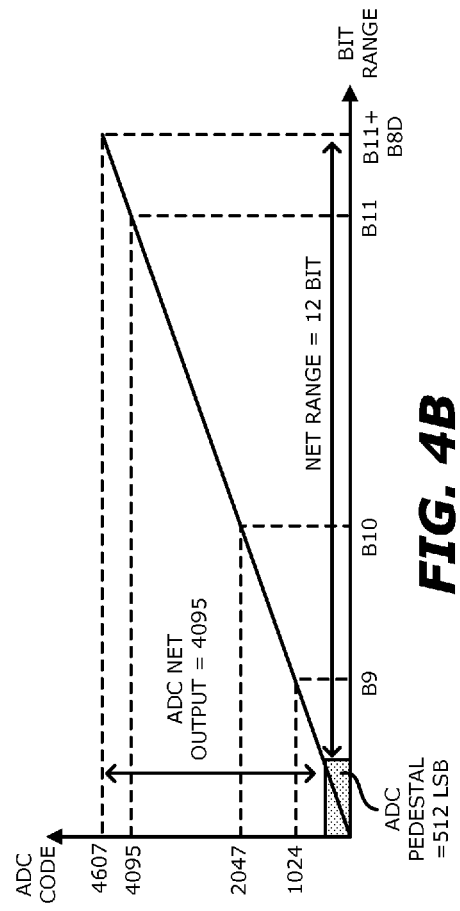
FIG. 4A
FIG. 4B

METHOD AND SYSTEM FOR IMPLEMENTING AN EXTENDED RANGE APPROXIMATION ANALOG-TO-DIGITAL CONVERTER

FIELD

An example of the present invention relates generally to an extended range approximation analog-to-digital converter. The invention may be used in relation to image sensors. More specifically, examples of the present invention are related to methods and systems for reading out image data from image sensor pixel cells, which include performing analog-to-digital conversion. Examples of the present invention include a method and a system for implementing correlated double-sampling with extended range approximation analog-to-digital converter.

BACKGROUND

High speed image sensors have been widely used in many applications in different fields including the automotive field, the machine vision field, and the field of professional video photography. The development of high speed image sensors is further driven by the consumer market's continued demand for high speed slow motion video and normal high-definition (HD) video that have a reduced rolling shutter effect.

In conventional complementary metal-oxide semiconductor ("CMOS") pixel cell, image charge is transferred from a photosensitive device (e.g., a photodiode) and is converted to a voltage signal inside the pixel cell on a floating diffusion node. The image charge can be readout from the pixel cell into readout circuitry and then processed. In conventional CMOS image sensors, the readout circuit includes an analog-to-digital converter (ADC). One type of ADC is the successive approximation ADC which converts the analog signal using a binary search. This binary search is implemented using a successive approximation register (SAR) that counts by trying all values of bits starting with the most-significant bit (MSB) and finishing at the least-significant bit (LSB) to converge upon a digital output that is the conversion of the analog signal.

However, in image sensors with SAR ADC, several percentages of the ADC range may be lost due to the need for an analog data pedestal to avoid clipping of offset and noise. For example, if the pedestal is 60 LSB or 160 LSB, the maximum range for a 12-bit ADC is 4036 LSB (e.g., 4096 LSB-60 LSB) or 3936 LSB (e.g., 4096 LSB-160 LSB). Thus, the analog pedestal reduces the maximum ADC range. While digital gain may be applied to stretch the maximum output to the desired range of 4096 LSB, the ADC is not a true 12-bit ADC.

BRIEF DESCRIPTION OF THE DRAWINGS

The embodiments of the invention are illustrated by way of example and not by way of limitation in the figures of the accompanying drawings in which like references indicate similar elements throughout the various views unless otherwise specified. It should be noted that references to "an" or "one" embodiment of the invention in this disclosure are not necessarily to the same embodiment, and they mean at least one. In the drawings:

FIG. 4A illustrates a graph of the bit range (x-axis) versus the ADC code range (y-axis) in an ADC circuitry having a 12-bit SAR (FIG. 4A) and FIG. 4B illustrates a graph of the bit range (x-axis) versus the ADC code range (y-axis) in ADC circuitry having the 13-bit SAR in FIG. 3 in accordance to one embodiment of the invention.

Figure 1:
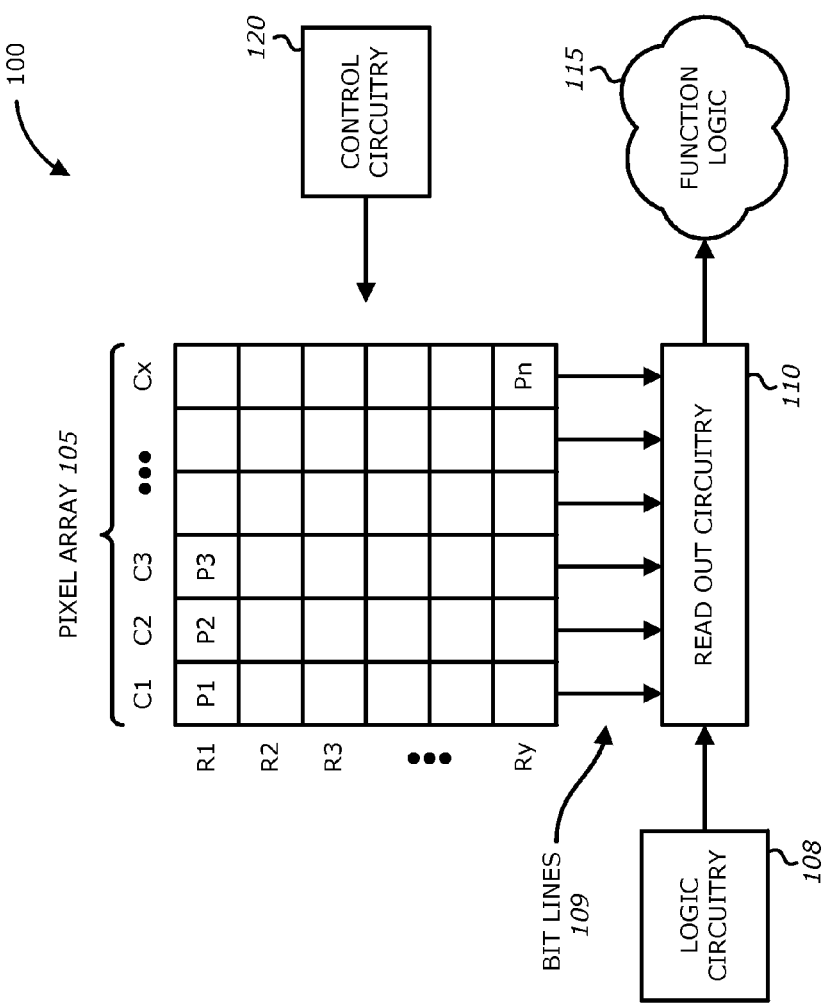
FIG. 1 is a block diagram illustrating an example imaging system including a readout circuitry that implements an extended range successive approximation ADC in accordance to one embodiment of the invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. However, it is understood that embodiments of the invention may be practiced without these specific details. In other instances, well-known circuits, structures, and techniques have not been shown to avoid obscuring the understanding of this description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Particular features, structures or characteristics may be included in an integrated circuit, an electronic circuit, a combinatorial logic circuit, or other suitable components that provide the described functionality.

Examples in accordance with the teaching of the present invention describe an image sensor readout circuitry that implements Correlated Double-Sampling (CDS) while extending the range of the ADC circuitry included in the readout circuitry. In one example, the range of the ADC circuitry is extended by including an additional bit in the SAR that is a duplicate of one of the bits therein.

FIG. 1 is a block diagram illustrating an example imaging system 100 that includes a readout circuitry 110 that implements extended range successive approximation ADC in accordance to one embodiment of the invention. For instance, readout circuitry 110 may implement correlated double-sampling (CDS) with extended range successive approximation ADC. Imaging system 100 may be a complementary metal-oxide-semiconductor ("CMOS") image sensor. As shown in the depicted example, imaging system 100 includes pixel array 105 coupled to control circuitry 120 and readout circuitry 110, which is coupled to function logic 115 and logic control 108.

The illustrated embodiment of pixel array 105 is a two-dimensional ("2D") array of imaging sensors or pixel cells (e.g., pixel cells P1, P2, . . . , Pn). In one example, each pixel cell is a CMOS imaging pixel. As illustrated, each pixel cell is arranged into a row (e.g., rows R1 to Ry) and a column (e.g., columns C1 to Cx) to acquire image data of a person, place or object, etc., which can then be used to render an image of the person, place or object, etc.

In one example, after each pixel has acquired its image data or image charge, the image data is read out by readout circuitry 110 through readout column bit lines 109 and then transferred to function logic 115. In one embodiment, a logic circuitry 108 can control readout circuitry 110 and output image data to function logic 115. In various examples, readout circuitry 110 may include amplification circuitry (not illustrated), analog-to-digital conversion (ADC) circuitry 220, or otherwise. Function logic 115 may simply store the image data or even manipulate the image data by applying post image effects (e.g., crop, rotate, remove red eye, adjust brightness, adjust contrast, or otherwise). In one example, readout circuitry 110 may read out a row of image data at a time along readout column lines (illustrated) or may read out the image data using a variety of other techniques (not illustrated), such as a serial read out or a full parallel read out of all pixels simultaneously.

In one example, control circuitry 120 is coupled to pixel array 105 to control operational characteristics of pixel array 105. For example, control circuitry 120 may generate a shutter signal for controlling image acquisition. In one example, the shutter signal is a global shutter signal for simultaneously enabling all pixels within pixel array 105 to simultaneously capture their respective image data during a single acquisition window. In another example, the shutter signal is a rolling shutter signal such that each row, column, or group of pixels is sequentially enabled during consecutive acquisition windows.

Figure 2:
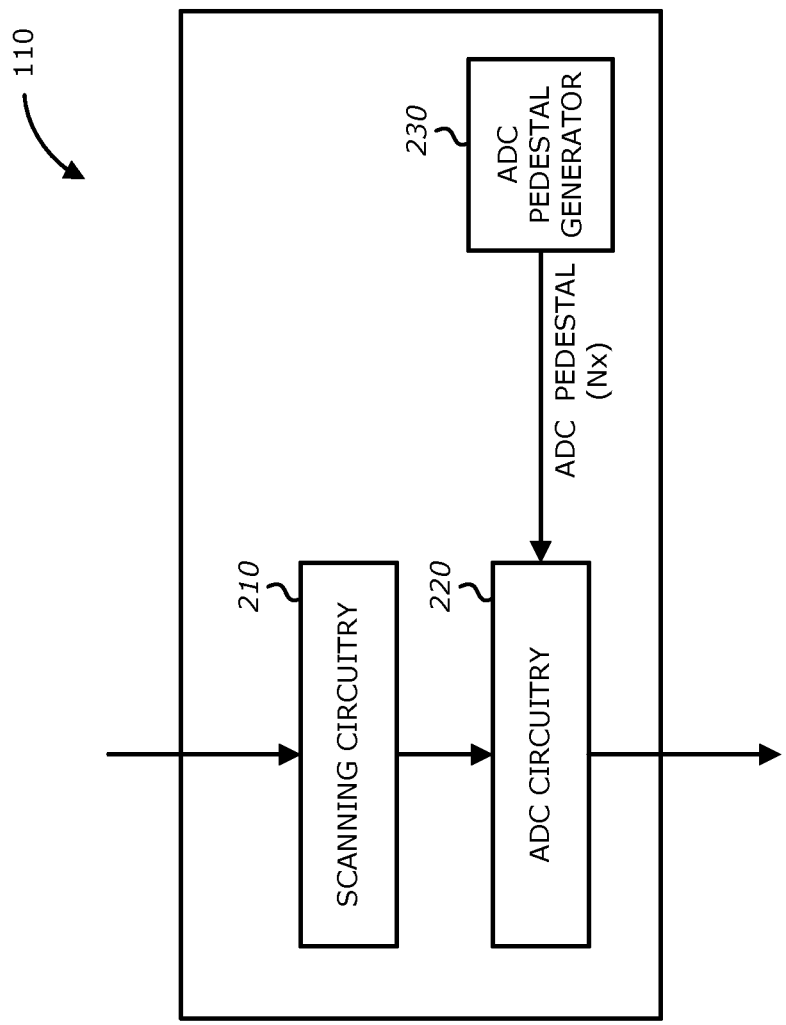
FIG. 2 is a block diagram illustrating the details of readout circuitry in FIG. 1 in accordance to one embodiment of the invention.

FIG. 2 is a block diagram illustrating the details of readout circuitry 110 of an imaging system 100 in FIG. 1 that implements correlated double-sampling (CDS) with extended range SAR ADC in accordance to one embodiment of the invention. As shown in FIG. 2, the readout circuitry 110 may include scanning circuit 210, an ADC circuitry 220, and an ADC pedestal generator 230. Scanning circuit 210 may include amplification circuitry, selection circuitry (e.g., multiplexers), etc. to readout a row of image data at a time along readout column bit lines 109 or may readout the image data using a variety of other techniques, such as a serial readout or a full parallel readout of all pixels simultaneously. ADC pedestal generator 230 may be coupled to ADC circuitry 220 to generate values to be used as ADC pedestals (Nx). Using an ADC pedestal, ADC circuitry 220 may sample image data from a row of pixel array 105 against ADC pedestal. In some embodiments, ADC pedestal is less than 512 LSB (e.g., less than bit-8 of SAR 307 in FIG. 3 being set). For example, ADC pedestal may be 128 LSB (e.g., setting bit-6 in SAR 307) or 256 LSB (e.g., setting bit-7 in SAR 307). In some embodiments, ADC pedestal is adjustable.

Figure 3:
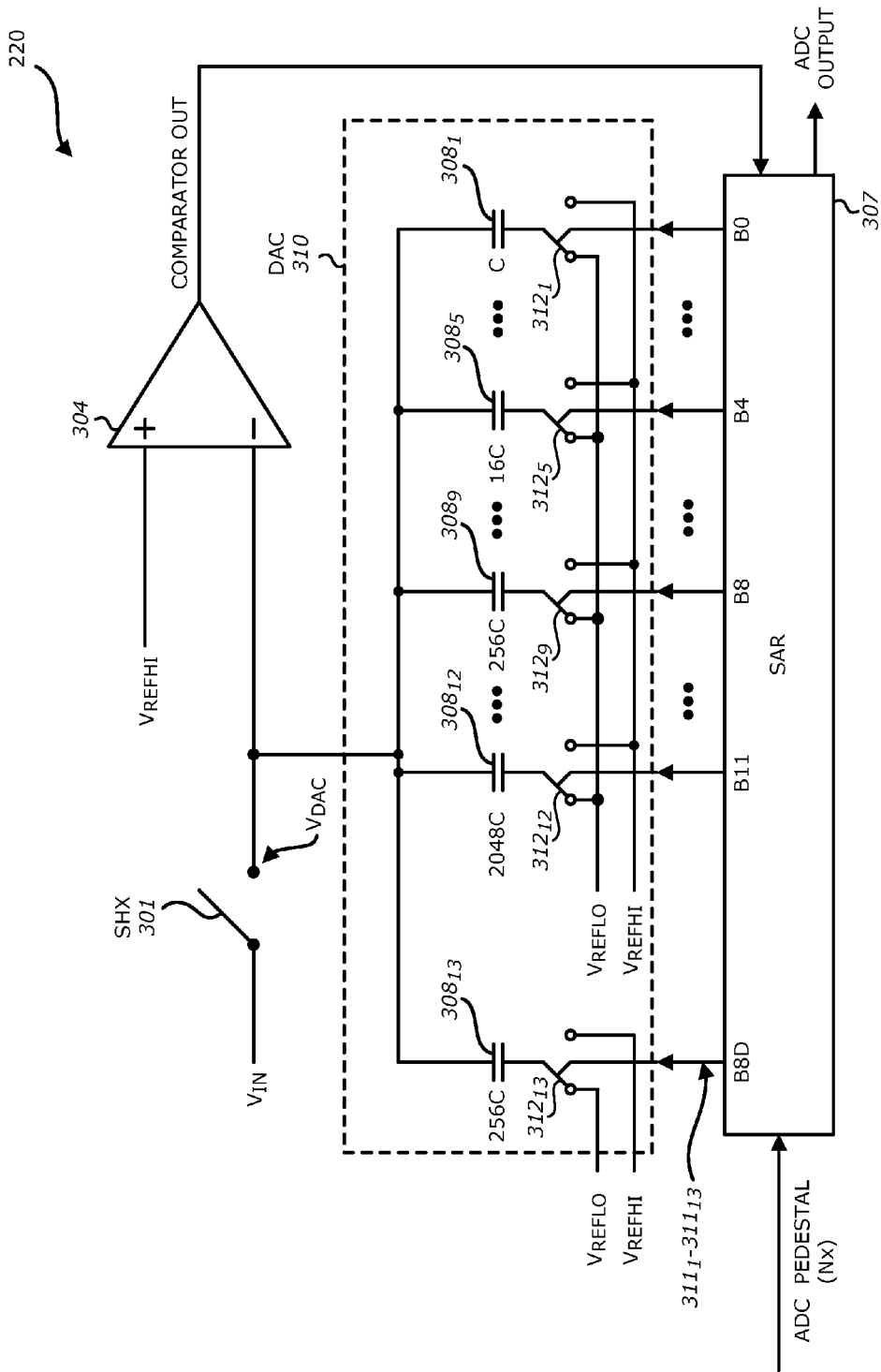
FIG. 3 is a block diagram illustrating the details of ADC circuitry in FIG. 2 in accordance to one embodiment of the invention.

FIG. 3 is a block diagram illustrating the details of ADC circuitry 220 in FIG. 2 in accordance to one embodiment of the invention. While not illustrated, in some embodiments, a plurality of ADC circuitry 220 may be included in readout circuitry 110. As shown in FIG. 3, ADC circuitry 220 includes a comparator 304 such as a fully differential op amp, a digital-to-analog converter (DAC) circuitry 310, and a SAR 307.

ADC circuitry 220 also comprises a plurality of DAC capacitors $308_1$-$308_p$ (p>1) coupled to a plurality of DAC switches $312_1$-$312_q$ (q>1) that are included in the DAC circuitry 310, and an input switch "SHX" 301.

In one embodiment, as shown in FIG. 3, DAC circuitry 310 includes a plurality of DAC capacitors $308_1$-$308_p$ that are in parallel. It understood that DAC circuitry 310 may include any number of DAC capacitors $308_1$-$308_p$ (e.g., p>1). In FIG. 3, DAC circuitry 310 includes thirteen DAC capacitors $308_1$-$308_{13}$ (e.g., p=13), wherein DAC capacitors $308_1$-$308_{12}$ are coupled to the bit-0 to bit-11 in SAR 307 and DAC capacitor $308_{13}$ is coupled to the additional bit in SAR 307 that is a duplicate of one of the bits included in bit-0 to bit-11 (e.g., B0 to B11). In one embodiment, the SAR 307 may include more than one duplicated bit. Further, while FIG. 3 illustrates DAC circuitry 310 to be a capacitor-implemented DAC, some embodiments include DAC circuitry 310 that are implemented using resistors or a hybrid of resistors and capacitors.

In one example, the additional bit is a duplicate of bit-8 (e.g., B8D) in FIG. 3. The back plates of DAC capacitors $308_1$-$308_p$ are respectively coupled to data output lines $311_1$-$311_w$ (w>1) of SAR 307. In some embodiments, SAR 307 includes thirteen data output lines (e.g., w=13), respectively coupled to thirteen parallel DAC capacitors $308_1$-$308_p$ (e.g., p=13). In some embodiments, the back plates of half of DAC capacitors $308_{13}$ (e.g., the DAC capacitors associated with the duplicated bit) are disconnected when ADC pedestal is set to bit-7 or less, and the back plates of three-fourths of DAC capacitors $308_{13}$ are disconnected when ADC pedestal is set to bit-6 or less. In some embodiments, the back plates of half of DAC capacitors $308_{13}$ are connected to a low voltage when ADC pedestal is set to bit-7 or less, and the back plates of three-fourths of DAC capacitors $308_{13}$ are connected to a low voltage when ADC pedestal is set to bit-6 or less.

As further shown in FIG. 3, the input voltage $V_{IN}$ is received from scanning circuitry 210 and corresponds to the image data or image charge from a pixel in pixel array 105. Upon closing of the input switch "SHX", the input voltage $V_{IN}$ is measured at the node $V_{DAC}$ such that the input voltage $V_{IN}$ is received and acquired by capacitors $308_1$-$308_p$ (e.g., p=13 in FIG. 3) in DAC circuitry 310. As shown in FIG. 3, the input signal $V_{IN}$ is sampled on DAC circuitry 310.

In one embodiment, the inputs of comparator 304 are respectively coupled to the high voltage reference $V_{REFHI}$ and the $V_{DAC}$ node. The output of comparator 304 (e.g., comparator out) is coupled to SAR 307. In some embodiments, comparator 304 is reset after each conversion of the voltage input $V_{IN}$ (e.g., when all of the samples in the row have been converted).

As shown in FIG. 3, SAR 307 includes a plurality of bits such as bit-0 to bit-11 (e.g., B0 to B11) and an additional bit (e.g., B8D), which is a duplicate of one of the bits included in bit-0 to bit-11 (e.g., B0 to B11). In FIG. 3, the additional bit is a duplicate of bit-8 (e.g., B8D). Each of the bits in SAR 307 is coupled respectively to a data output line $311_1$-$311_w$. In FIG. 3, the additional bit B8D is coupled to data output line 31113 (e.g., w=13), respectively.

In one embodiment, the size of the additional bit is adjustable. The additional bit may the same size or larger than the ADC pedestal (Nx) to avoid lost of code range. For instance, when ADC pedestal is 128 LSB (e.g., setting bit-6 in SAR 307), the additional bit is a duplicate of bit-6 or higher bits (e.g., bit-7 to bit-11 in FIG. 3). Since a maximum range of an SAR ADC is set by the sum of the bits in the SAR DAC (or the code range of the SAR DAC), in the embodiment in FIG. 3, the maximum code range for a 12-bit ADC circuitry 220 may thus be increased up to 12.5 bits by duplicating bit-11 as the additional bit to produce 6144 output codes. In this embodiment, LSB step size remains fixed and the post-CDS full scale of ADC circuitry 220 is the same as a true 12-bit or larger SAR ADC. In one embodiment, one of the lower bits (e.g., bit 8 of SAR 307) and adding one extra conversion cycle, the range of DAC circuitry 310 is extended. In this embodiment, bit 8 is duplicated, in other embodiments; the size of the duplicated bit may be adjustable. When the pedestal is set to bit 7 or less, let the back plates of half the capacitors of duplicated bit 8 are disconnected. When the pedestal is set of 6 bits or less, let three-quarters of the capacitors of duplicated bit 8 are disconnected. In other embodiments, instead of disconnecting the back plates of the capacitors of the duplicated bit, they may be connected to a low voltage.

Referring to FIG. 3, data output lines $311_1$-$311_w$ are coupled to a high voltage reference $V_{REFHI}$ (e.g., 1.0 V) and to a low voltage reference $V_{REFLO}$ (e.g., ground) via a plurality of DAC switches $312_1$-$312_q$ (q>1), respectively, and control DAC circuitry 310 by driving the back plates of DAC capacitors $308_1$-$308_p$. For example, if first data output line $311_1$ (e.g., B0) is 0, then the back plate of DAC capacitor $308_1$ that is coupled thereto is connected to low voltage reference $V_{REFLO}$ (e.g., ground), and if first data output line $311_1$ is 1, then the back plate of DAC capacitor $308_1$ that is coupled thereto is connected to the high voltage reference $V_{REFHI}$. In some embodiments, the bits in SAR 307 are used to respectively select whether the data output lines $311_1$-$311_w$ are coupled to high voltage reference $V_{REFHI}$ (e.g., 1.0 V) or to a low voltage reference $V_{REFLO}$ (e.g., ground).

SAR 307 is reset before each conversion of sampled input data (e.g., $V_{SHR1}$, $V_{SHS1}$). The sampled input data is obtained by ADC circuitry 220 sampling the image data from a given row that is being processed.

When ADC circuitry 220 samples the result level (e.g., SHR1) or signal level (e.g., SHS1), which are two separate sampling events, rather than sampling the input signal $V_{IN}$ against ADC DAC 0 level where each of DAC capacitors $308_1$-$308_{13}$ are coupled to $V_{REFLO}$ (e.g., ground), in one embodiment, DAC circuitry 310 may be set to the ADC pedestal (Nx) value to avoid any signals becoming smaller than the 0 level (e.g., due to noise or other non-ideal effects). For instance, DAC circuitry 310 may be set to the ADC pedestal (Nx) value by setting bit 8 (e.g., coupling DAC capacitor $308_9$ to $V_{REFHI}$) during the sampling of the result level or the signal level. After the sampling, in this embodiment, the bit 8 that was set is then reset such that all of the DAC circuitry 310 bits are low (e.g., coupled to $V_{REFLO}$). In this manner, the analog sampled signal (e.g., $V_{SHR1}$, $V_{SHS1}$) is shifted by the ADC pedestal (Nx). In other words, the analog sampled signal has a pedestal. Thus, ADC circuitry 220 is prevented from converting signals lower than the real 0 level due to the shifted analog sampled signal.

SAR 307 in conjunction with DAC circuitry 310 perform a binary search and each bit in data output lines $311_1$-$311_w$ is set in succession from the most significant bit (MSB) to least significant bit (LSB). In one embodiment, the setting or resetting by SAR 307 of the additional bit is performed after the setting or resetting of the bit that the additional bit is duplicating. For instance, when the additional bit is a duplicate of bit-8 (e.g., B8D), SAR 307 sets or resets the additional bit after SAR 307 sets or resets bit-8. In one embodiment, comparator 304 determines whether a bit in data output lines $311_1$-$311_w$ should remain set or be reset. Similarly, comparator 304 determines to set or reset the plurality of bits and the additional bit stored in SAR 307 in succession from MSB to LSB and the determination to set or reset the additional bit is performed after the determination to set or reset the bit that the additional bit is duplicating. At the end of the conversion, SAR 307 holds a conversion of the sampled input data in addition to the conversion of the additional bit (e.g., ADC output). In the embodiment in FIG. 3, after a 13-bit conversion, ADC circuitry 220 outputs the code B<11:0> as well as the additional bit B8D. To obtain the ADC converted value of the sampled input data, an addition of the two values provides the 13-bit code. In one embodiment, the addition is performed an adder (not shown) and is transmitted to function logic 115. In some embodiments, SAR 307 performs the addition of the two values to provide the 13-bit code. In other embodiments, if ADC pedestal is equal to the extra code range, a 12-bit code results from the digital CDS. Using the duplicated bit in this embodiment compensates for the initial ADC pedestal (Nx) (e.g., the analog sampled signal being shifted by the ADC pedestal (Nx)) such that high signals are not above a maximum code range of DAC circuitry 310.

As an example, if the node $V_{DAC}$ had a value of V1 and SAR 307 includes 13 bits of storage and is storing a value equal to 0 (e.g., output lines $311_1$-$311_w$=B<11:0>=0x000), because DAC capacitors $308_1$-$308_p$ are binary coded, by sweeping through all the possible codes (from 0 to 4607) by SAR 307, the node $V_{DAC}$ would increase linearly from V1 to approximately V1+$V_{REFHI}$.

In some embodiments, outputs lines $311_1$-$311_w$ of SAR 307 are coupled to a multiplexer (not shown) that is controlled by logic circuitry 108 to set a pedestal value. In this embodiment, the contents of SAR 307 (e.g., $V_{SHR1}$) may be transferred to a readout memory (not shown) included in readout circuitry 110 during the sampling of the next value (e.g., $V_{SHS1}$).

In this embodiment, because comparator 304 is reset during the SHR1 (e.g., when $V_{IN}$ is equal to the pixel reset value) in FIG. 4, and the voltage input signal $V_{IN}$ is sampled on DAC circuitry 310, the conversions of the $V_{SHR}$ sampled input values will result in values that are close to the value of the ADC pedestal.

Referring to FIGS. 1 and 3, each of the elements of ADC circuitry 220 may be controlled by logic circuitry 108. In one example, logic circuitry 108 may transmit signals to control the timing of the opening and closing of switch "SHX" 301. In other example, logic circuitry 108 generates and transmits the signals to control resetting of comparator 304, SAR 307 and DAC circuitry 310. Logic circuitry 108 may also generate and transmit signals to control ADC pedestal generator 230 to generate ADC pedestals (Nx).

FIG. 4A illustrates a graph of the bit range (x-axis) versus the ADC code range (y-axis) in a prior art ADC circuitry having a 12-bit SAR (FIG. 4A). The prior art 12-bit ADC circuitry that does not include the additional bit that is a duplicate may reach a range of 4095 LSBs when all the bits are set. However, ADC pedestal of 512 LSB reduces the prior art 12-bit ADC circuitry's net output to 3583 LSB (e.g., 4095 LSB-512 LSB) and thus, reduces the net range to less than 12 bits. In contrast, FIG. 4B illustrates a graph of the bit range (x-axis) versus the ADC code range (y-axis) in ADC circuitry 220 having the 13-bit SAR in FIG. 3 in accordance to one embodiment of the invention. By duplicating the bit-8 as the additional bit (e.g., B8D), the ADC output code is increased (or extended) to 4607 LSB. Accordingly, even though ADC pedestal of 512 LBS reduces the range, ADC net output is still 4095 (e.g., 4607 LSB-512 LSB) and the net range is 12 bits. In this embodiment, by setting ADC pedestal to less than 512 LSB, the data output after CDS is not clipped and may saturate a 12 bit range. With regards to row time costs, one mid-range bit conversion by ADC circuitry 220 in the embodiment in FIG. 3 for the signal sample may be 80 nanoseconds (ns). In this embodiment, the cost in terms of area is one SAR register bit (e.g., the additional bit) and one 8b capacitor (e.g., DAC capacitor $308_{13}$). In other embodiments, the signal sample depends on the resolution of ADC among other factors, and may be a few tens of nanoseconds.

Thus, the extended ADC range as provided by embodiments of the invention helps to reduce and mitigate lost codes and range resulting from, for instance, digital CDS (e.g., removes offset, suppresses low frequency noise), corrections (or subtractions) in digital domain (e.g., dark current subtraction), and change in pixel level from comparator 304 reset release to ADC SHR sampling (e.g., mitigating "soft-BSUN").

Moreover, the following embodiments of the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, etc.

Figure 5:
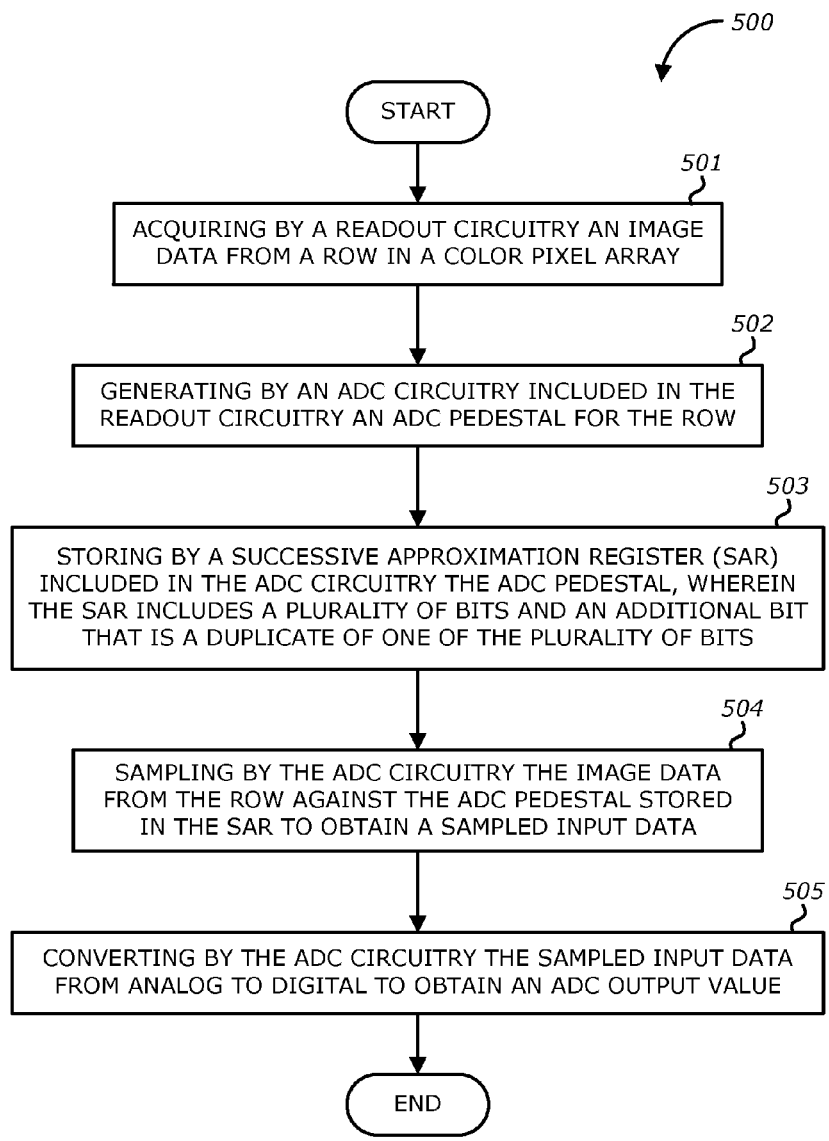
FIG. 5 is a flowchart illustrating a method of implementing an extended range successive approximation ADC in accordance to one embodiment of the invention.

FIG. 5 is a flowchart illustrating a method 500 of implementing an extended range successive approximation ADC in accordance to one embodiment of the invention.

Method or process 500 starts with the readout circuitry acquiring an image data from a given row n in the color pixel array (block 501), where (n≥1). In one embodiment, the readout circuitry includes a scanning circuitry that selects and amplifies the image data from the given row n. The scanning circuitry may include at least one multiplexer to select the image and at least one amplifier to amplify the image data. The scanning circuitry may also transmit the image data that is selected and amplified to the ADC circuitry for further processing.

At block 502, an ADC circuitry included in the readout circuitry generates an ADC pedestal for the given row n. In some embodiments, ADC pedestal is adjustable and is less than 512 LSB. For example, ADC pedestal may be 128 LSB or 256 LSB.

At block 503, SAR included in ADC circuitry stores the ADC pedestal. SAR includes a plurality of bits and an additional bit that is a duplicate of one of the plurality of bits. For instance, SAR may include 13 bits, wherein the plurality of bits includes 12 bits and the additional bit is the duplicate of bit-8. In one embodiment, the additional bit is adjustable and is the same size or larger than ADC pedestal.

At block 504, ADC circuitry 220 samples the image data from the row n to obtain a sampled input data. In this embodiment, ADC circuitry 220 is sampling against the value stored in the SAR (e.g., ADC pedestal from ADC pedestal generator 230). In one embodiment, ADC circuitry 220 samples the image data from the given row on DAC circuitry 310 that is included in ADC circuitry 220 to obtain the sampled input data.

At block 505 in FIG. 5, ADC circuitry 220 converts from analog to digital the sampled input data to obtain an ADC output value. Accordingly, the ADC output value is the digitized value corresponding to the sampled input data. In some embodiments, converting the sampled input data from analog to digital includes performing a binary search using DAC circuitry 310 and SAR 307 that are both included in ADC circuitry 220. ADC circuitry 220 may also include a comparator 304. In this embodiment, to perform the conversion of the sampled input data from analog to digital, comparator 304 determines whether to set or reset a plurality of bits stored in SAR 307 in succession from the MSB to the LSB. The determination by comparator 304 to set or reset the additional bit is performed after the determination to set or reset the bit that the additional bit is duplicating. In this embodiment, SAR 307 sets or resets each of the plurality of bits stored therein based on the determination by the comparator 304. Similarly, the setting or resetting by SAR 307 of the additional bit is performed after the setting or resetting of the bit that the additional bit is duplicating. Once the LSB stored in SAR 307 is set or reset by SAR 307, the value stored in SAR 307 is the ADC output value, which is a digitally converted value of the sampled input data. In one embodiment, at the end of the conversion, SAR 307 holds a conversion of the sampled input data in addition to the conversion of the additional bit (e.g., ADC output). To obtain the ADC converted value of the sampled input data, an addition of the two values provides the 13-bit code. In other embodiments, if ADC pedestal is equal to the extra code range, a 12-bit code results from the digital CDS. The ADC output value may then be outputted to a function logic 115 or stored in a memory that is included in readout circuitry 110.

The processes explained above are described in terms of computer software and hardware. The techniques described may constitute machine-executable instructions embodied within a machine (e.g., computer) readable storage medium, that when executed by a machine will cause the machine to perform the operations described. Additionally, the processes may be embodied within hardware, such as an application specific integrated circuit ("ASIC") or the like.

While embodiments of the invention are described as being implemented in image sensor, embodiments of the invention may be used with any ADC application to cover for pedestals or to obtain a larger code range.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

The invention claimed is:

1. A method of implementing an extended range successive approximation analog-to-digital converter (ADC), comprising:

acquiring by a readout circuitry an image data from a row in a color pixel array;

generating by an ADC circuitry included in the readout circuitry an ADC pedestal for the row;

storing by a Successive Approximation Register (SAR) included in the ADC circuitry the ADC pedestal, wherein the SAR includes a plurality of bits and an additional bit that is a duplicate of one of the plurality of bits;

sampling by the ADC circuitry the image data from the row against the ADC pedestal stored in the SAR to obtain a sampled input data; and converting by the ADC circuitry the sampled input data from analog to digital to obtain an ADC output value.

2. The method of claim 1, wherein the additional bit is the same size or larger than the ADC pedestal.

3. The method of claim 1, wherein the ADC pedestal is less than 512 least significant bit (LSB), wherein bit-8 in the SAR is set.

4. The method of claim 1, wherein SAR includes 13 bits, wherein the plurality of bits includes 12 bits and the additional bit is the duplicate of bit-8.

5. The method of claim 1, wherein the ADC pedestal is adjustable and the size of the duplicate bit is adjustable.

6. The method of claim 1, wherein the ADC pedestal being one of:
128 LSB, wherein bit-6 in the SAR is set, or
256 LSB, wherein bit-7 in the SAR is set.

7. The method of claim 1, wherein acquiring by the readout circuitry the image data from the row further comprises:
selecting and amplifying by a scanning circuitry included in the readout circuitry the image data from the row; and
transmitting the image data from the row to the ADC circuitry.

8. The method of claim 1, wherein sampling by the ADC circuitry the image data from the row to obtain the sampled input data further comprises:
sampling the image data on a digital-to-analog (DAC) circuitry included in the ADC circuitry to obtain the sampled input data.

9. The method of claim 8, wherein converting by the ADC circuitry the sampled input data from analog to digital to obtain the ADC output value further comprises:
performing a binary search using the DAC circuitry and the SAR.

10. The method of claim 9, wherein the DAC circuitry includes a plurality of capacitors, wherein the back plates of half of the capacitors associated with the additional bit and included in the DAC are disconnected when the ADC pedestal is set to bit-7 or less, and
wherein the back plates of three-fourths of the capacitors associated with the additional bit and included in the DAC are disconnected when the ADC pedestal is set to bit-6 or less.

11. The method of claim 10, wherein converting by the ADC circuitry the sampled input data from analog to digital to obtain the ADC output value further comprises:
determining by a comparator included in the ADC circuitry to set or reset the plurality of bits and the additional bit stored in the SAR in succession from a most significant bit (MSB) to LSB, wherein determination by the comparator to set or reset the additional bit is performed after the determination to set or reset the bit that the additional bit is duplicating,
setting or resetting by the SAR each of the bits stored in the SAR based on the determination by the comparator to obtain the ADC output value, wherein the setting or resetting by the SAR of the additional bit is performed after the setting or resetting of the bit that the additional bit is duplicating, and
outputting from the SAR the ADC output value to a function logic.

12. A system comprising:
a color pixel array for acquiring image data, the pixel array including a plurality of rows and columns; and
a readout circuitry coupled to the color pixel array to acquire an image data from a row in the color pixel array, wherein the readout circuitry includes an analog-to-digital conversion (ADC) circuitry to:
generate an ADC pedestal for sampling from the row,
store in a Successive Approximation Register (SAR) included in the ADC circuitry the ADC pedestal, wherein the SAR includes a plurality of bits and an additional bit that is a duplicate of one of the plurality of bits;
sample the image data from the row against the ADC pedestal stored in the SAR to obtain a sampled input data, wherein the image data is sampled on a digital-to-analog (DAC) circuitry included in the ADC circuitry, and
convert each of the sampled input data from analog to digital to obtain an ADC output value, wherein converting by the ADC circuitry includes performing a binary search using the SAR and the DAC circuitry.

13. The system of claim 12, wherein the additional bit is the same size or larger than the ADC pedestal.

14. The system of claim 12, wherein the ADC pedestal is less than 512 least significant bit (LSB), wherein bit-8 in the SAR is set.

15. The system of claim 12, wherein SAR includes 13 bits, wherein the plurality of bits includes 12 bits and the additional bit is the duplicate of bit-8.

16. The system of claim 12, wherein the ADC pedestal is adjustable and the size of the duplicate bit is adjustable.

17. The system of claim 12, wherein the ADC pedestal being one of:
128 LSB, wherein bit-6 in the SAR is set, or
256 LSB, wherein bit-7 in the SAR is set.

18. The system of claim 12, wherein the readout circuitry further comprises a scanning circuitry, wherein acquiring by the readout circuitry the image data from the row further comprises:
selecting and amplifying by the scanning circuitry included in the readout circuitry the image data from the row; and
transmitting the image data from the row to the ADC circuitry.

19. The system of claim 12, wherein the DAC circuitry includes a plurality of capacitors,
wherein the back plates of half of the capacitors associated with the additional bit and included in the DAC are disconnected when the ADC pedestal is set to bit-7 or less, and
wherein the back plates of three-fourths of the capacitors associated with the additional bit and included in the DAC are disconnected when the ADC pedestal is set to bit-6 or less.

20. The system of claim 12, wherein the ADC circuitry further comprises:
a comparator to determine to set or reset the plurality of bits and the additional bit stored in the SAR in succession from a most significant bit (MSB) to LSB, wherein determination by the comparator to set or reset the additional bit is performed after the determination to set or reset the bit that the additional bit is duplicating,
wherein the SAR sets or resets each of the bits stored in the SAR based on the determination by the comparator to obtain ADC output value, wherein the setting or resetting by the SAR of the additional bit is performed after the setting or resetting of the bit that the additional bit is duplicating.

21. A method of implementing an extended range successive approximation analog-to-digital converter (ADC), the method comprising:
generating by an ADC circuitry an ADC pedestal for sampling from a row in a color pixel array, wherein the ADC pedestal is less than 512 least significant bit (LSB);

storing by a Successive Approximation Register (SAR) included in the ADC circuitry the ADC pedestal, wherein the SAR includes thirteen (13) bits including twelve (12) bits and an additional bit that is a duplicate of bit-8 in the 12 bits;

sampling by the ADC circuitry the image data from the row against the ADC pedestal stored in the SAR to obtain a sampled input data; and converting by the ADC circuitry the sampled input data from analog to digital to obtain an ADC output value, wherein converting by the ADC circuitry includes performing a binary search using the SAR.

22. The method of claim 21, wherein sampling by the ADC circuitry further comprises:

sampling the image data on a digital-to-analog (DAC) circuitry included in the ADC circuitry to obtain the plurality of sampled input data.

23. The method of claim 22, wherein converting by the ADC circuitry includes:

performing the binary search using the DAC circuitry.

24. The method of claim 23, wherein the DAC circuitry includes a plurality of capacitors, wherein the back plates of half of the capacitors associated with the additional bit and included in the DAC are disconnected when the ADC pedestal is set to bit-7 or less, and wherein the back plates of three-fourths of the capacitors associated with the additional bit and included in the DAC are disconnected when the ADC pedestal is set to bit-6 or less.

25. The method of claim 23, wherein converting by the ADC circuitry includes:

determining by a comparator included in the ADC circuitry to set or reset the plurality of bits and the additional bit stored in the SAR in succession from a most significant bit (MSB) to LSB, wherein determination by the comparator to set or reset the additional bit is performed after the determination to set or reset the bit that the additional bit is duplicating, setting or resetting by the SAR each of the bits stored in the SAR based on the determination by the comparator to obtain the ADC output value, wherein the setting or resetting by the SAR of the additional bit is performed after the setting or resetting of the bit that the additional bit is duplicating, and outputting from the SAR the ADC output value to a function logic.

* * * * *